(12) United States Patent  
Chen

(10) Patent No.: US 8,426,855 B2  
(45) Date of Patent: Apr. 23, 2013

(54) PAD STRUCTURE HAVING A METALIZED REGION AND A NON-METALIZED REGION

(75) Inventor: Hsien-Wei Chen, Sinying (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 153 days.

(21) Appl. No.: 12/693,501

(22) Filed: Jan. 26, 2010

(65) Prior Publication Data

US 2010/0123135 A1 May 20, 2010

Related U.S. Application Data

(62) Division of application No. 11/556,018, filed on Nov. 2, 2006, now Pat. No. 7,679, 195.

(60) Provisional application No. 60/805,270, filed on Jun. 20, 2006.

(51) Int. Cl.  
*H01L 23/58* (2006.01)

(52) U.S. Cl.  
USPC ............................................ 257/48; 257/797

(58) Field of Classification Search ............... 257/48, 257/797  
See application file for complete search history.

(56) References Cited

U.S. PATENT DOCUMENTS

| | | | |
|---|---|---|---|
| 5,003,374 A | 3/1991 | Vokoun, III | |
| 5,998,228 A | 12/1999 | Eldridge et al. | |
| 6,063,640 A * | 5/2000 | Mizukoshi et al. | 438/15 |
| 6,521,975 B1 * | 2/2003 | West et al. | 257/620 |
| 6,534,853 B2 | 3/2003 | Liu et al. | |
| 6,844,631 B2 * | 1/2005 | Yong et al. | 257/786 |
| 7,026,833 B2 * | 4/2006 | Rincon et al. | 324/754.18 |
| 7,098,544 B2 | 8/2006 | Edelstein et al. | |
| 7,105,930 B2 | 9/2006 | Lua et al. | |
| 7,132,303 B2 * | 11/2006 | Wang et al. | 438/17 |
| 7,317,203 B2 * | 1/2008 | Chen et al. | 257/48 |
| 7,928,591 B2 * | 4/2011 | Chen | 257/797 |
| 2004/0147097 A1 * | 7/2004 | Pozder et al. | 438/584 |
| 2005/0164527 A1 | 7/2005 | Radza et al. | |
| 2005/0230005 A1 * | 10/2005 | Liang et al. | 148/33.3 |
| 2005/0285614 A1 * | 12/2005 | Ma | 324/765 |
| 2006/0087021 A1 * | 4/2006 | Hirose | 257/686 |

(Continued)

FOREIGN PATENT DOCUMENTS

| | | |
|---|---|---|
| JP | 62261139 | 11/1987 |
| JP | 2005191334 | 7/2005 |
| TW | 388085 | 4/2000 |

OTHER PUBLICATIONS

Official Action issued on Dec. 27, 2010, in counterpart Taiwan patent application.

*Primary Examiner* — Marcos D. Pizarro  
*Assistant Examiner* — Bilkis Jahan  
(74) *Attorney, Agent, or Firm* — Duane Morris LLP; Steven E. Koffs

(57) ABSTRACT

An interconnect structure includes: a plurality of dielectric layers having aligned process control monitor (PCM) pads, and a conductive structure above a topmost one of the PCM pads. The conductive structure electrically connects the topmost PCM pad to a device under test above a level of the topmost PCM pad. The conductive structure is sized and shaped so as to leave a majority portion of the topmost PCM pad exposed for access by a test probe.

21 Claims, 4 Drawing Sheets

U.S. PATENT DOCUMENTS

| | | |
|---|---|---|
| 2006/0109014 A1 | 5/2006 | Chao et al. |
| 2006/0202359 A1* | 9/2006 | Chen .............................. 257/797 |
| 2006/0256495 A1* | 11/2006 | Tominaga ..................... 361/118 |
| 2007/0020778 A1 | 1/2007 | Yi et al. |
| 2007/0117253 A1* | 5/2007 | Hsu et al. ........................ 438/75 |
| 2007/0293019 A1* | 12/2007 | Jeng et al. ..................... 438/460 |
| 2008/0157358 A1* | 7/2008 | Yang ............................. 257/737 |

* cited by examiner

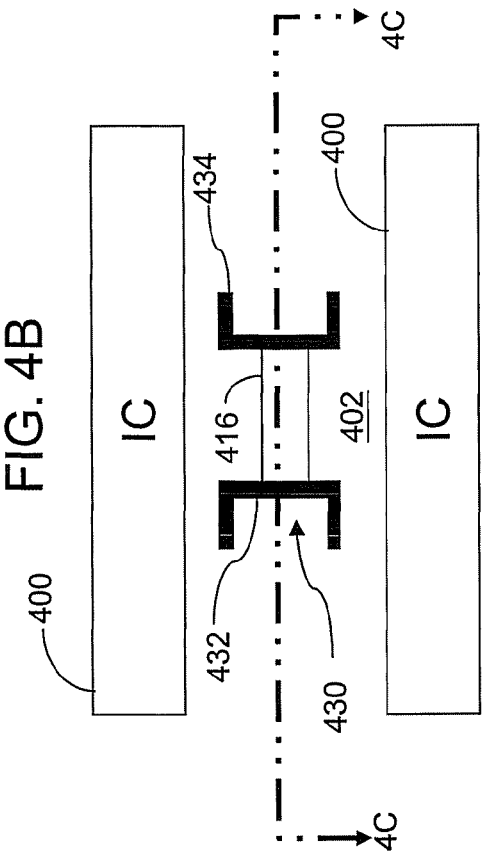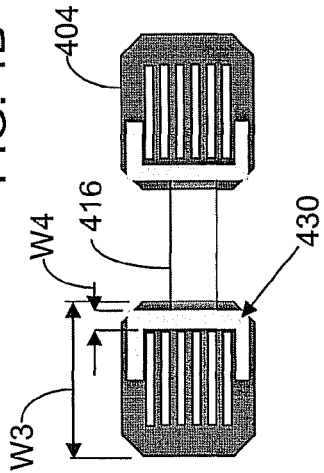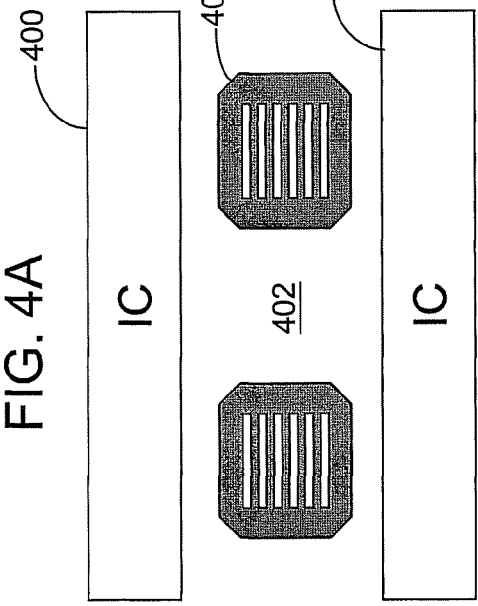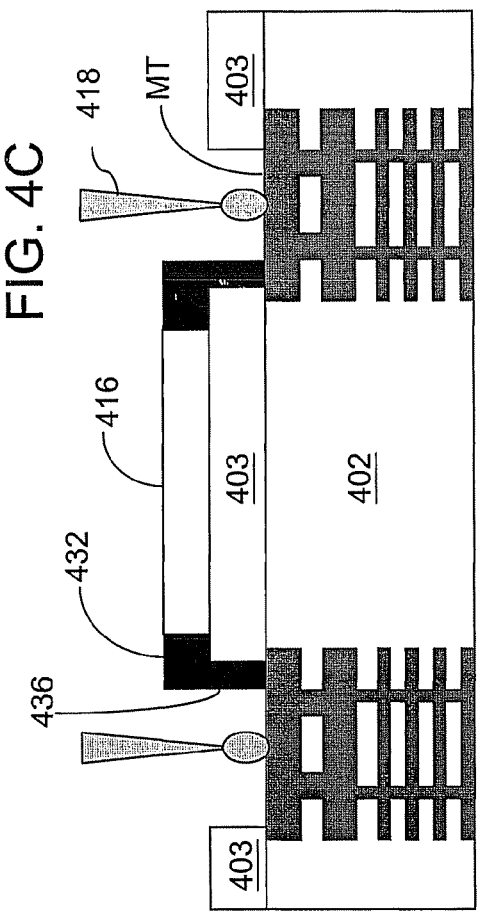

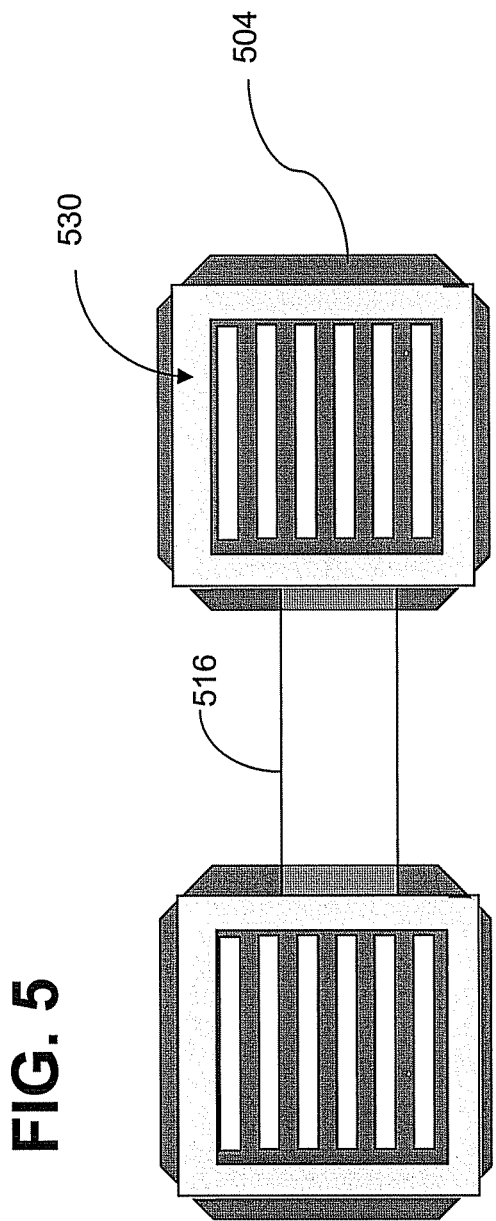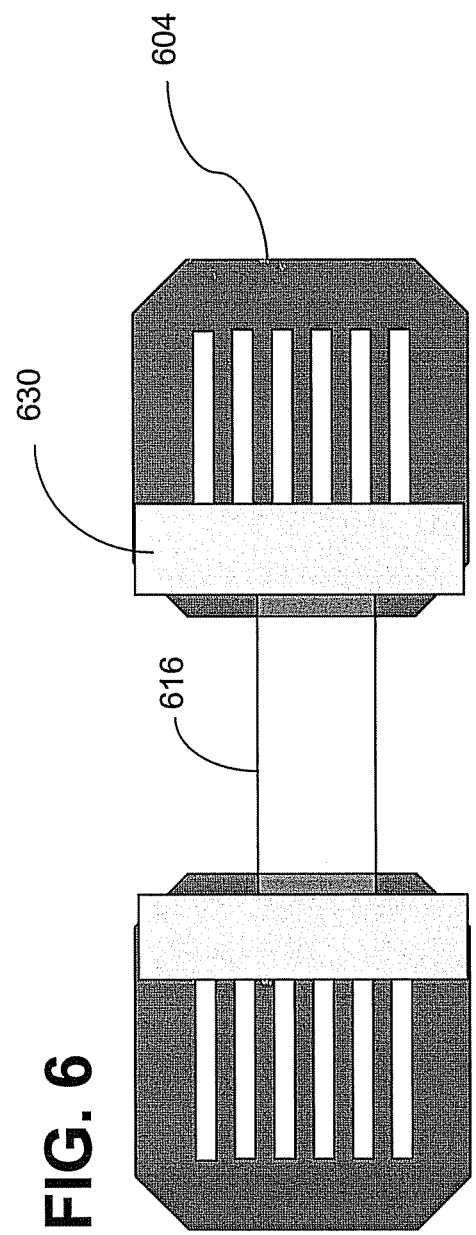

PAD STRUCTURE HAVING A METALIZED REGION AND A NON-METALIZED REGION

This application is a division of U.S. application Ser. No. 11/556,018, filed Nov. 2, 2006, which claims the benefit of U.S. Provisional Patent Application No. 60/805,270, filed Jun. 20, 2006, both of which applications are incorporated by reference herein in their entireties.

FIELD OF THE INVENTION

The present invention relates to semiconductor devices and fabrication techniques generally, and more particularly relates to interconnect structures and test methods.

BACKGROUND

In order to achieve high-integration and high-speed, dimensions of semiconductor integrated circuits have been reduced, and various materials and techniques have been proposed and used during fabrication. For example, dual damascene technology and copper conductors are applied to reduce resistances and resistance-capacitance (RC) delay of interconnect structures in ICs. As ICs are made smaller, and the distance between adjacent lines is reduced, low-k (low dielectric constant) dielectric materials are used in advanced copper interconnect technology to reduce these delays.

Interconnect structures of semiconductor ICs connect the various active devices and circuits of the IC to a plurality of conductive pads on the external surface of the die. Multi-level interconnect structures have been developed that accommodate the advances in active-device density by more effectively routing conductive paths between the active devices and the surface of the die. In typical IC designs, five or more individual interconnect levels of conductive paths may be used to accommodate the active-device density. Multi-level interconnect structures arrange the metallization lines in multiple layers. The metallization lines of each individual level are formed in an interlevel dielectric (ILD) material. The ILD electrically isolates the metallization lines from one another within each level of the interconnect structure and electrically isolates metallization lines in adjacent levels.

Damascene processes are routinely used in back-end-of-line (BEOL) processing for fabricating multi-level interconnect structures. In a damascene process, trenches and vias are etched in a layer of ILD and filled with a conductive material, such as copper (Cu) or a Cu-based alloy, to create conductive lines and vertical conductive paths between the interconnect lines in different levels.

The conductive paths of the multi-level interconnect structures terminate in bond pads at the surface of the IC. The bond pads are relatively large metal areas distributed about the die. Bond pads are used to establish electrical contact between the integrated circuits and either a package substrate of an IC package or a probe pin (that is used for wafer acceptance testing, or WAT). The pads used during WAT are also referred to as, "process control monitor (PCM) pads". A probe makes an electrical contact between a probe pin and the bond pads, so voltage or current can be applied to test for device functionality and performance. Large bond pads allow longer probe needles, thus increasing parallel testing capability. The bond pads that are used for WAT may be distributed in the scribe lines between dies. These scribe lines are severed during the die singulation process, with the cuts passing through the bond pads.

A conventional approach for configuring the WAT bond pads of the interconnect structure is to include bond pads in the scribe line on each interconnect layer, aligned beneath the bond pads in scribe line of the top metal layer, and to include metal-filled vias connecting the bond pads in each of the interconnect levels, aligned beneath each bonding pad or probe pad in the top metal layer. The bond pads in the first interconnect (M1) layer may be used for in situ testing before the second (M2) through top metal (MT) layers are formed. FIG. 1A is a plan view showing a portion of a scribe line 102 between two IC's 100, with a copper bond pad structure 104 (layers M1 to MT).

An aluminum pad 114 is formed over the pad 104 of the top metal (MT) layer. The aluminum pad 114 may be connected to a device under test (DUT) 116 in the aluminum (MT+1) layer. For the WAT or circuit probing (CP) test, the probe 118 is in direct contact on the Al Pad 114. FIG. 1B is a plan view of the aluminum pad layer (MT+1) above the copper pad 104 shown in FIG. 1A. FIG. 1C is a cross sectional view taken along section line 1C-1C of FIG. 1B. Thus, the PCM pad 120 includes the duplicated structure 104 (which may have width and length of 50 µm/70 µm, respectively) layer by layer in layers M1-M9 plus the Al pad 114.

The dicing (or singulation) process can produce a large mechanical stress, which may be dependent on numerous conditions, including: cut width, die saw speed, die saw temperature, die saw pressure, etc.

Conventional multi-level interconnect structures have been susceptible to failure due to cracking when the PCM pad 120 is cut by a die saw. Experience has shown that during singulation, the dielectric in the scribe lines 102 may crack in the vicinity of the bond pads 120, and that these cracks may propagate to the dies 100. This problem becomes more acute when low-k dielectric materials (including extreme low k, ELK and ultra low k, ULK) are used for the ILD material, because low-k dielectric materials are more brittle than high k dielectrics. Cracking is severe in the aluminum layer.

It is desirable to decrease the failure rate during the die saw process, which in turn will result in a higher production yield.

SUMMARY OF THE INVENTION

In some embodiments, an interconnect structure comprises a plurality of dielectric layers having aligned process control monitor (PCM) pads in at least one scribe line. A conductive structure above a topmost one of the PCM pads electrically connects the topmost PCM pad to a device under test above a level of the topmost PCM pad. The conductive structure is sized and shaped so as to leave a majority portion of the topmost PCM pad exposed for access by a circuit probe.

In some embodiments, a wafer, comprises a substrate having a plurality of integrated circuits formed above the substrate, and at least one scribe line between two of the integrated circuits. A plurality of dielectric layers are formed in the at least one scribe line having aligned process control monitor (PCM) pads formed therein. A conductive structure above a topmost one of the PCM pads electrically connects the topmost PCM pad to a device under test above a level of the topmost PCM pad. The conductive structure is sized and shaped so as to leave a majority portion of the topmost PCM pad exposed for access by a circuit probe.

In some embodiments, a structure comprises a plurality of dielectric layers having aligned process control monitor (PCM) pads in at least one scribe line. The topmost PCM pad has a metallized region and a non-metallized region. A conductive structure above a topmost one of the PCM pads electrically connects the topmost PCM pad to a device under test above a level of the topmost PCM pad. The conductive structure overlies at least a portion of the metallized region, but does not overlie the non-metallized region.

BRIEF DESCRIPTION OF THE DRAWINGS

FIG. 4A is a plan view of a PCM pads in a scribe line, according to an exemplary embodiment of the invention.

FIG. 4B is a plan view of an aluminum pad, which overlies the top PCM pad of FIG. 4A.

FIG. 4C is a cross sectional view taken across section line 4C-4C of FIG. 4B.

FIG. 4D is a plan view showing the aluminum pad structure of FIG. 4B, overlying the PCM pads of FIG. 4(a).

FIG. 5 is a variation of the embodiment of FIG. 4B.

FIG. 6 is another variation of the embodiment of FIG. 4B.

DETAILED DESCRIPTION

Figure 1A:
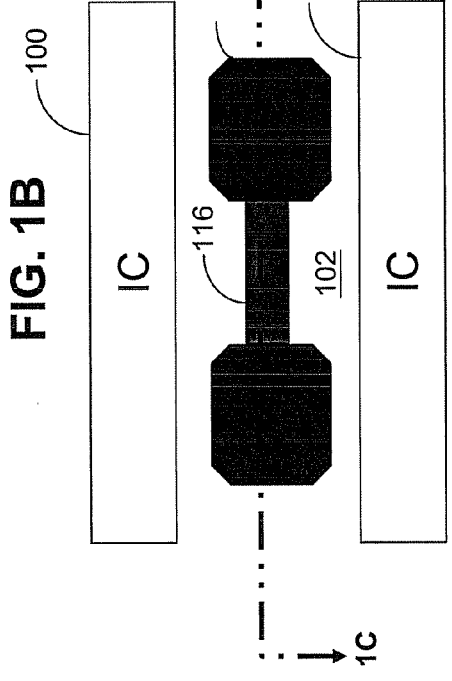
FIG. 1A is a plan view of conventional PCM pads in a scribe line.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In the die saw process of low-K (LK) generation semiconductor products, cracking has been observed. The cracking mechanism is complex, but the inventor has determined that it is strongly related to the metal density when the die saw blade moves across the PCM pad in the scribe lines of the wafer during singulation. When the die saw blade moves across the larger metal structure of the PCM pads (having higher metal amount/density) the probability of crack formation is increased. In the scribe line structure, the PCM pad has a higher amount of metal and may result in crack damage in the dicing process.

Figure 2A:
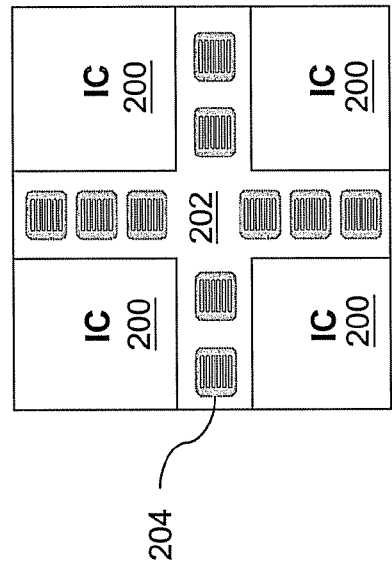
FIGS. 2A-2C show three substrates with scribe lines having respectively different pad densities.
Figure 2C:
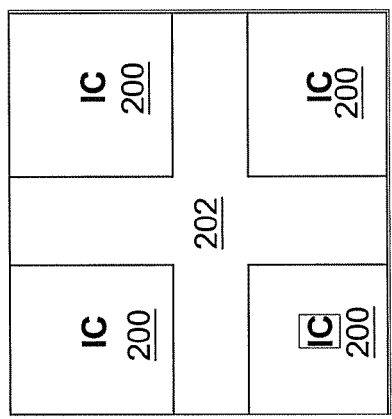
Figure 2B:
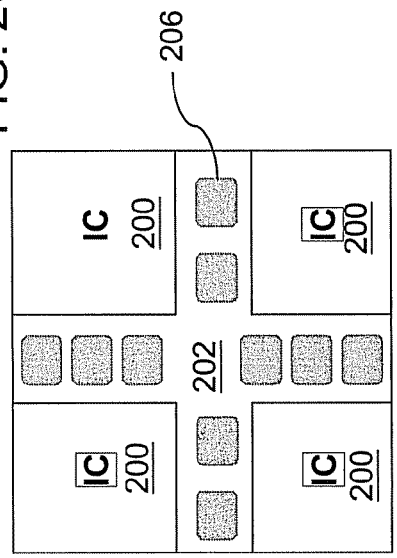

FIGS. 2A-2C show some examples of wafers having dies 200 with scribe lines 202 therebetween. These examples introduce the concept of pad density. The bond pad structures in FIGS. 2A-2C includes metal areas and non-metallized areas. The term, "pad density" is used herein to denote the ratio of the total metal area within a pad structure (as viewed from above in a plan view) to the total area of that pad structure. In FIG. 2A, there are no PCM pads in the scribe line 202 (0% metal density). Cracking is not observed during die sawing.

In FIG. 2B, the metal density of each bond pad 204 is about 64%. Within each bond pad 204, each of the 12 non-metallized areas ("slots") is about 40 μm by 2.6 μm. The remaining area has metal. The pad density equals [(70×50)−12×(40×2.6)]/(70×50)=0.64. Some cracking is observed.

In FIG. 2C, the bond pads 206 are solid metal regions, with no non-metallized areas (i.e., pad density equals 100%). Cracking in the scribe line 202 is observed, and the cracks may propagate to the dies 200.

Figure 3:
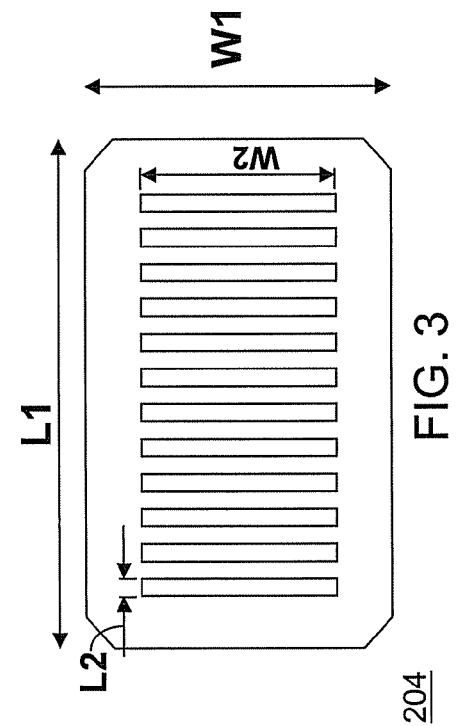
FIG. 3 is an enlarged view of the bond pad shown in FIG. 2B.

FIG. 3 shows is an enlarged view of the pad configuration of FIG. 2B, including a metallized region and a non-metallized region. This example includes a copper pad 204 having 64% pad density (because 36% of the area is occupied by 12 non-metallized 40×2.6 μm slots). In this example the non-metallized region comprises a plurality of distinct slots. In other embodiments, the non-metallized region may include a smaller number of wider slots, a single wider opening, or a larger number of smaller apertures.

In addition to the effects of individual bond pads 104 with high metal density, there is also a cumulative effect if many of the pad layers in the stacked configuration have a relatively high metal density. The term "cumulative density" is used herein to denote an average (e.g., arithmetic mean, median or mode) of the pad densities of the PCM pads 104, in each level beginning at the first (M1) interconnect level and ending with the top metal (MT) level, and including the aluminum pad 114. Due to the cumulative effect in a multi-level structure 120 (FIG. 1C) having a large cumulative pad density, the cracking failure rate is a problem, particularly if the cumulative pad density is about 65% or greater. Thus, the cumulative pad density can be calculated as the average of the pad densities of a sequence of aligned bond pads 104 in each level from M1 to MT, plus the Al level 114. The likelihood of cracks during the die saw process is reduced when the cumulative pad density is about 50% or less.

As described above, the PCM pad structure 120 has a larger metal density and also results in the severe cracking issue in the dicing process.

Table 1 shows the volume of the metal in the PCM pad 120 in several of the layers of an interconnect structure for a 65 nm wafer (taking into account the respective metal thickness in each layer).

TABLE 1

| Layer Number | Metal Dimension ($\mu m^3$) |
| --- | --- |
| 4M | 1882 |
| 5M | 2374 |
| 6M | 2867 |
| 7M | 3360 |
| 8M | 5376 |
| Al | 4200 |
| 8M + Al | 9576 |

Table 2 shows the metal thickness for various layers (where Mx indicates an inter-metal layer, and MT indicates the top metal layer). Notably, the volume of the metal is greater in the upper layers, and layers 8M and Al have the greatest volume.

TABLE 2

| Layer | Thickness (Å) |
| --- | --- |
| M1 | 1800 |
| Mx(2-7) | 2200 |
| MT(8) | 9000 |
| Aluminum | 12000 |

Based on the determination that the cracking problem is more severe when the bond pad density is greater, the inventor has further determined that the duplicated pad 114 in the aluminum layer occupies almost half the metal volume of the fully stacked PCM pad structure 120. A major portion of the aluminum pad 114 duplicates the footprint of the top (MT) bond pad 104, with which it is in conductive contact. Therefore, the PCM pad in the aluminum layer can be modified as shown in FIGS. 4A-4D.

Figure 1B:
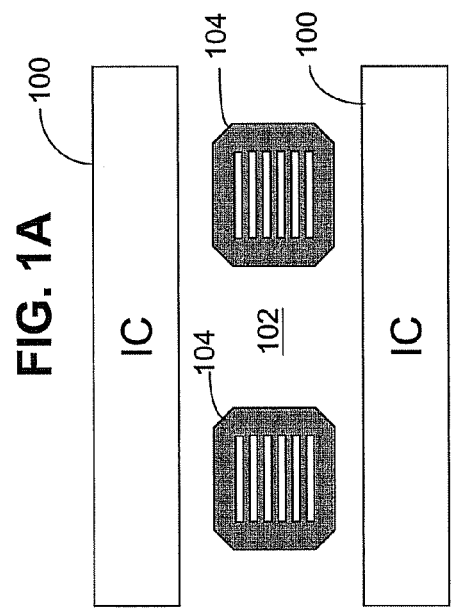
FIG. 1B is a plan view of a conventional aluminum pad, which overlies the top PCM pad of FIG. 1A.
Figure 1C:
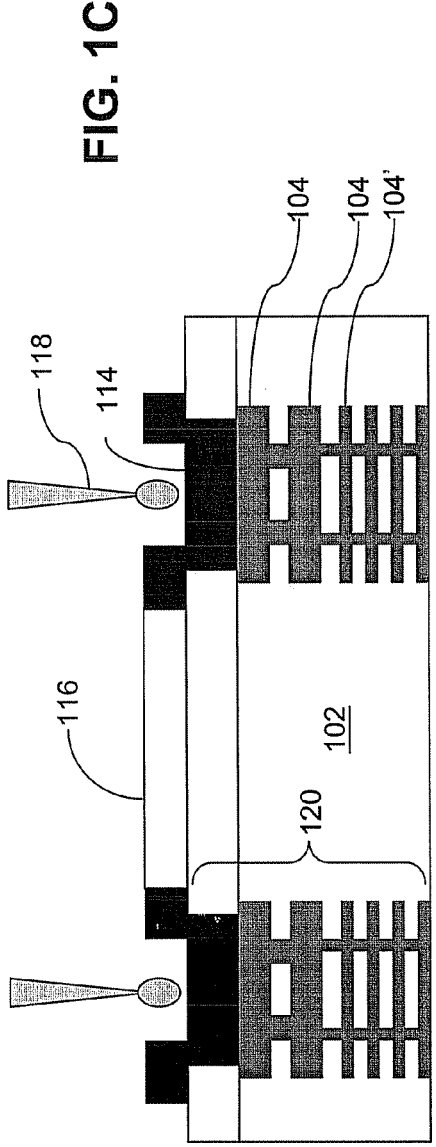
FIG. 1C is a cross sectional view taken across section line 1C-1C of FIG. 1B.

Instead of using an aluminum pad 114 with 100% density as shown in FIGS. 1 and 3, the aluminum pad 114 is replaced by a smaller block or contact 430 to reduce the fully stacked (cumulative) PCM metal density (volume) in this configuration. The contact 430 is above the topmost PCM pad (In this context, "above" refers to the level or height of the contact 430, and does not require that the contact 430 covers the topmost PCM pad.). In FIG. 4A, the top Cu layer 404 ($M_T$) can have the same configuration as described above with reference to FIG. 1A. In FIGS. 4B and sectional view 4C, the aluminum layer is patterned to provide a contact 436 extending downward (through the passivation layer 403) to provide direct conductive contact between the DUT 416 and the top Cu PCM pad 404 of layer $M_T$. It will be understood by one of ordinary skill that as used herein, the term "device under test" (DUT) is not limited to a device that is currently under test, but also encompasses a device to be tested in the future.

In this configuration, the majority of the aluminum overlying the topmost PCM pad 404 is omitted. In some embodiments, the duplication of aluminum overlying copper is reduced by more than 50%. In some embodiments, the duplication of aluminum overlying copper is reduced by about 60% to about 85%.

In some embodiments, a conductive structure 430 contacts a first portion of the topmost PCM pad 404 near the device under test 416 without extending over a second portion of the topmost PCM pad distal from the device under test.

In FIG. 4B, the Cu contact pads 404 of FIG. 4A are omitted from the drawing for clarity, but the relationship between the aluminum structure 430 and the top contact pad 404 is shown in plan view in FIG. 4D.

This small (aluminum) block or contact 430 electrically connects the DUT 416 with the lower-level ($M_T$) pad 404 as shown in FIG. 4C. By substituting the small block or contact 430 for the large aluminum pad 114 (FIG. 1), it is possible to reduce the duplicated metal density (i.e., to reduce the aluminum overlying a similarly shaped copper pad). Preferably, the small (aluminum) block or contact 430 is as small as possible (e.g., a line width of about 3 μm or less). Also the contact extension lines 434 may be positioned at the edge of PCM pad 404 (to avoid the duplicated pad density shown in FIG. 1C).

As shown in the plan view of FIGS. 4B and 4D, the aluminum layer may optionally include one or more contact extension lines 434, which extend over the bond pad 404 of the $M_T$ layer, ensuring a desired contact area. The shape, length and number of these contact extensions 434 may be varied. In some preferred embodiments, the contact extension lines 434 are parallel to the length of the scribe line 402. In other embodiments (not shown), the contact extension lines are not parallel to the scribe line 402, but they do not cross over the centerline of the scribe line (through which the die saw passes).

FIG. 4D is a plan view showing the aluminum conductive structure or contact 430 and the underlying Cu (MT) layer 404, which it contacts. In the example of FIG. 4D, the contact extension lines 434 are placed on the aluminum layer 432 at or near the maximum displacement from the center of the scribe line 402. In this example, because the die saw passes through the center of the scribe line 402, the die saw only passes through the aluminum in the vertical contact portion 432, 436, and does not pass through the contact extension lines 434.

FIGS. 4C and 4D show that the conductive structure 430 has a contact portion 436 extending substantially vertically from the device under test 416, through a passivation layer 403, to contact the topmost PCM pad 404. The contact portion 436 has a width W4 (FIG. 4D) that is small relative to a length W3 of the topmost PCM pad 404. For example, in some embodiments, the ratio of W4:W3 may be about 0.2 or less. In some embodiments, the ratio of W4:W3 may be about 0.15 or less.

In some embodiments, the topmost PCM pad 404 has a metallized region (e.g., the solid region at the perimeter) and a non-metallized region (e.g., some or all of the central region); the conductive structure 430 overlies at least a portion of the metallized region, but does not overlie the non-metallized region. In other embodiments, if the PCM pad has an alternative configuration (not shown) with a non-metallized region at a different location than the center, the conductive structure 430 can be modified to contact the metallized region, without overlying the non-metallized region.

In addition, the shape of conductive structure or contact 430 is not limited to the example in FIGS. 4B-4D. For example, the distal ends of the extension lines may be connected to form a ring 530 around the perimeter of the top metal (MT) PCM pad 504, as shown in FIG. 5. More generally, for PCM pads 504 having a variety of different shapes, the contact structure 530 may be shaped as a polygon extending around a perimeter of the topmost PCM pad 504, with an opening that leaves an interior region of the topmost PCM pad exposed. Many other configurations are contemplated.

In some embodiments, the aluminum pattern is configured to provide the minimum conductive path between the DUT and the top ($M_T$) Cu PCM pad. For example, the contact extension lines 434 may be omitted, in which case the cross sectional view would appear as shown in FIG. 4C, throughout the width of the bond pad 404. FIG. 6 shows an example in which the contact extension lines are omitted, but the width of the aluminum conductive structure 630 is increased slightly, to enhance the conductive contact between the aluminum conductive structure 630 and the top ($M_T$) Cu PCM pad 604.

Alternatively, the contact extension lines 434 may be substantially shorter than those shown in FIGS. 4B and 4D, with a minimum length to reduce a likelihood of delamination or loss of contact between the aluminum 436 and underlying copper PCM pad 404.

Although an example is provided in which the PCM bond pads 404 are made of copper and the MT+1 layer 430 is aluminum, one of ordinary skill can readily apply the structures described above to other configurations, in which different metals are used.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:
1. A structure comprising:
   a plurality of dielectric layers having aligned process control monitor (PCM) pads in at least one scribe line, a topmost one of the PCM pads being located in a topmost metal line layer and having a metalized region and a non-metalized region; and a conductive structure patterned in a contact layer above the topmost one of the PCM pads, the conductive structure electrically directly contacting the topmost PCM pad and connecting the topmost PCM pad to a device under test above a level of the topmost PCM pad, wherein the conductive structure overlies a portion of the metalized region so as to leave a portion of the topmost PCM pad uncovered to permit direct contact by a probe, but does not overlie the non-metalized region.

2. The structure of claim 1, wherein the conductive structure contacts a first portion of the topmost PCM pad near the device under test without extending over a second portion of the topmost PCM pad distal from the device under test.

3. The structure of claim 1, wherein the conductive structure includes:
a plurality of contact extension lines that extend parallel to the scribe line, the contact extension lines being offset from a center of the scribe line;
an additional line connecting the contact extension lines together at distal ends of the contact extension lines; and
a contact portion extending substantially vertically from the device under test, through a passivation layer, to contact the topmost PCM pad, the contact portion having a width that is small relative to a length of the topmost PCM pad.

4. The structure of claim 1, wherein the conductive structure includes a top portion that contacts the device under test, and is continuous with a contact portion extending vertically from the first portion to contact the topmost PCM pad.

5. The structure of claim 1, wherein the contact portion does not extend outward in the plane of the topmost PCM pad.

6. The structure of claim 5, wherein the contact portion is about as wide as a width of an outer ring of the metalized region of the topmost PCM pad.

7. A method of forming the structure of claim 1, comprising:
forming the plurality of dielectric layers having aligned process control monitor (PCM) pads in at least one scribe line between a pair of integrated circuit dice; and
patterning an aluminum layer to form the conductive structure above the topmost one of the PCM pads.

8. The method of claim 7, wherein the conductive structure includes:
a plurality of contact extension lines that extend parallel to the scribe line, the contact extension lines being offset from a center of the scribe line;
an additional line connecting the contact extension lines together at distal ends of the contact extension lines; and
a contact portion extending substantially vertically from the device under test, through a passivation layer, to contact the topmost PCM pad, the contact portion having a width that is small relative to a length of the topmost PCM pad.

9. The method of claim 7, wherein the conductive structure includes a top portion that contacts the device under test, and is continuous with a contact portion extending vertically from the first portion to contact the topmost PCM pad at least along an entire width of the metalized outer ring on a proximal end of the topmost PCM pad.

10. The structure of claim 1, wherein the conductive structure overlies a portion which is less than 50% of the metalized region, so as to leave a majority portion of the topmost PCM pad uncovered for direct contact by a probe.

11. The structure of claim 1, wherein:
the plurality of dielectric layers are included in a single semiconductor wafer; and
the conductive structure in the contact layer is included in the portion of the single semiconductor wafer.

12. A structure comprising:
a plurality of dielectric layers having aligned process control monitor (PCM) pads in at least one scribe line, a topmost one of the PCM pads being located in a topmost metal line layer and having a metalized region and a non-metalized region; and
a conductive structure patterned in a contact layer above the topmost one of the PCM pads, the conductive structure electrically directly contacting the topmost PCM pad and connecting the topmost PCM pad to a device under test above a level of the topmost PCM pad, wherein the conductive structure overlies a first portion of the metalized region, but does not overlie the non-metalized region, and includes:
a ring formed in the contact layer directly contacting the topmost PCM pad, the ring at or near a perimeter of the topmost PCM pad, the ring surrounding an opening in the conductive structure through which a second portion of the metalized region is uncovered to permit direct contact by a probe.

13. The structure of claim 12, wherein the perimeter of the topmost PCM pad is included in the metalized region, and the non-metalized region of the topmost PCM pad is enclosed by the ring.

14. The structure, of claim 13, wherein the non-metalized region includes a plurality of slots.

15. The structure of claim 12, wherein:
the plurality of dielectric layers are included in a single semiconductor wafer; and
the conductive structure in the contact layer is included in the portion of the single semiconductor wafer.

16. A wafer, comprising:
a substrate having a plurality of integrated circuits formed above the substrate, and at least'one scribe line between two of the integrated circuits;
a plurality of dielectric layers having aligned process control monitor (PCM) pads in at least one scribe line, a topmost one of the PCM pads being located in a topmost metal line layer and having a metalized region and a non-metalized region;
a passivation layer in the at least one scribe line between the two integrated circuits, on a topmost one of the plurality of dielectric layers and above a level of the PCM pads, and
a conductive structure patterned in a contact layer above the topmost one of the PCM pads, the conductive structure directly contacting the topmost PCM pad and electrically connecting the topmost PCM pad to a device under test above a level of the topmost PCM pad, wherein the conductive structure overlies a portion of the metalized region so as to leave a portion of the topmost PCM pad exposed for access, but does not overlie the non- metalized region.

17. The structure of claim 16, wherein the conductive structure contacts a first portion of the topmost PCM pad near the device under test without extending over a second portion of the topmost PCM pad distal from the device under test.

18. The structure of claim 16, wherein the conductive structure includes:
a plurality of contact extension lines that extend parallel to the scribe line, the contact extension lines being offset from a center of the scribe line;
an additional line connecting the contact extension lines together at distal ends of the contact extension lines; and a contact portion extending substantially vertically from the device under test, through a passivation layer, to contact the topmost PCM pad, the contact portion having a width that is small relative to a length of the topmost PCM pad.

19. The structure of claim 16, wherein the conductive structure includes:
a ring on the topmost PCM pad, the ring at or near a perimeter of the topmost PCM pad.

20. The structure of claim 19, wherein
the non-metalized region of the topmost PCM pad is enclosed by the ring.

21. The wafer of claim 16, wherein the conductive structure includes a top portion that contacts the device under test, and is continuous with a contact portion extending vertically from the first portion to contact the topmost PCM pad at least along an entire width of the metalized outer ring on a proximal end of the topmost PCM pad.

* * * * *

UNITED STATES PATENT AND TRADEMARK OFFICE
CERTIFICATE OF CORRECTION

PATENT NO. : 8,426,855 B2  Page 1 of 1
APPLICATION NO. : 12/693501
DATED : April 23, 2013
INVENTOR(S) : Hsien-Wei Chen It is certified that error appears in the above-identified patent and that said Letters Patent is hereby corrected as shown below:

In the Claims:

Claim 16, Column 8, Line 37, delete "least ' one" and insert -- least one --.

Signed and Sealed this
Twelfth Day of November, 2013

Teresa Stanek Rea
*Deputy Director of the United States Patent and Trademark Office*